(12) United States Patent
Kanai

(10) Patent No.: US 6,467,016 B1
(45) Date of Patent: Oct. 15, 2002

(54) APPARATUS TO RECORD DIGITAL DATA ON NON-VOLATILE MEMORY CARD FOR RECORDING IN UNITS OF BLOCKS OF DIGITAL DATA AND METHOD THEREOF

(75) Inventor: Hirofumi Kanai, Saitama-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/532,777

(22) Filed: Mar. 22, 2000

(30) Foreign Application Priority Data

Mar. 23, 1999 (JP) .......................................... 11-078388

(51) Int. Cl.[7] .......................... G06F 12/00; G06F 13/14; G06F 13/12
(52) U.S. Cl. ....................... 711/103; 711/170; 711/165; 345/520; 345/501; 710/68
(58) Field of Search ................................. 711/170, 103, 711/165; 710/68; 348/231; 345/521, 501

(56) References Cited

U.S. PATENT DOCUMENTS

| | | | | |
|---|---|---|---|---|
| 4,414,624 A | * | 11/1983 | Summer | 364/200 |
| 5,337,275 A | | 8/1994 | Garner | 365/189.01 |
| 5,563,655 A | * | 10/1996 | Lathrop | 348/231 |
| 5,590,306 A | * | 12/1996 | Watanabe | 395/422 |
| 5,987,573 A | * | 11/1999 | Hiraka | 711/156 |
| 6,145,069 A | * | 11/2000 | Dye | 711/170 |
| 6,170,047 B1 | * | 1/2001 | Dye | 711/170 |
| 6,275,804 B1 | * | 8/2001 | Carl | 704/270 |

FOREIGN PATENT DOCUMENTS

DE      196 33 648 A1      2/1998

* cited by examiner

*Primary Examiner*—Do Hyun Yoo
*Assistant Examiner*—Kimberly McLean
(74) *Attorney, Agent, or Firm*—Oblon, Spivak, McClelland, Maier & Neustadt, P.C.

(57) ABSTRACT

A control means 24A reads an unrecorded area of a recording medium 25 in advance, and stores the read unrecorded area in a stack of a RAM 11. The unrecorded area is stored in the stack of the RAM 11 by being pushed onto the bottom of a stack pointer. When new data is recorded on the recording medium 25, recording is executed in order from the top of the stack pointer. Accordingly, information which continuously progresses in a time series manner can be recorded on the recording medium 25 without lack of the information which continuously progresses, and it is possible to reduce the time required to calculate and display the remaining recording time.

5 Claims, 10 Drawing Sheets

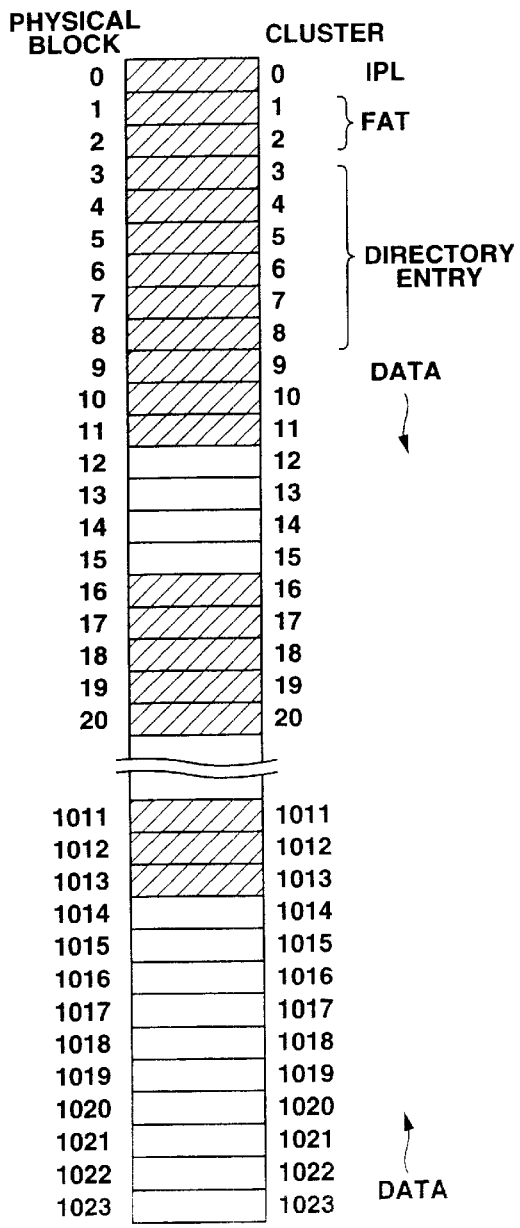

FIG.4A

| PHYSICAL BLOCK | CLUSTER | |
|---|---|---|
| 0 | 0 | IPL |
| 1 | 1 | FAT |
| 2 | 2 | FAT |
| 3 | 3 | DIRECTORY ENTRY |
| 8 | 8 | |
| 9 | 9 | FILE3 |
| 10 | 10 | FILE3 |
| 11 | 11 | FILE3 |
| 12 | 12 | FILE3 |
| 13 | 13 | FILE2 |
| 14 | 14 | FILE2 |
| 15 | 15 | FILE3 |
| 16 | 16 | FILE3 |
| 17 | 17 | FILE4 |
| 18 | 18 | FILE4 |
| 19 | 19 | |
| 20 | 20 | |

FIG.4B

DIRECTORY ENTRY

| FILE NAME | TIME DATE | FAT | FILE SIZE |
|---|---|---|---|
| FILE3 | 00:00 XX/XX/XX | 9 | 48K |
| FILE2 | XX:XX ΔΔ/ΔΔ/ΔΔ | 13 | 16K |
| FILE4 | 00:00 XX/XX/XX | 17 | 16K |

FIG.4C

| CLUSTER | FAT |
|---|---|
| 9 | 10 |
| 10 | 11 |
| 11 | 12 |
| 12 | 15 |
| 13 | 14 |
| 14 | FFFh |
| 15 | 16 |
| 16 | FFFh |
| 17 | 18 |
| 18 | FFFh |
| | 00 |
| | 00 |
| | 00 |

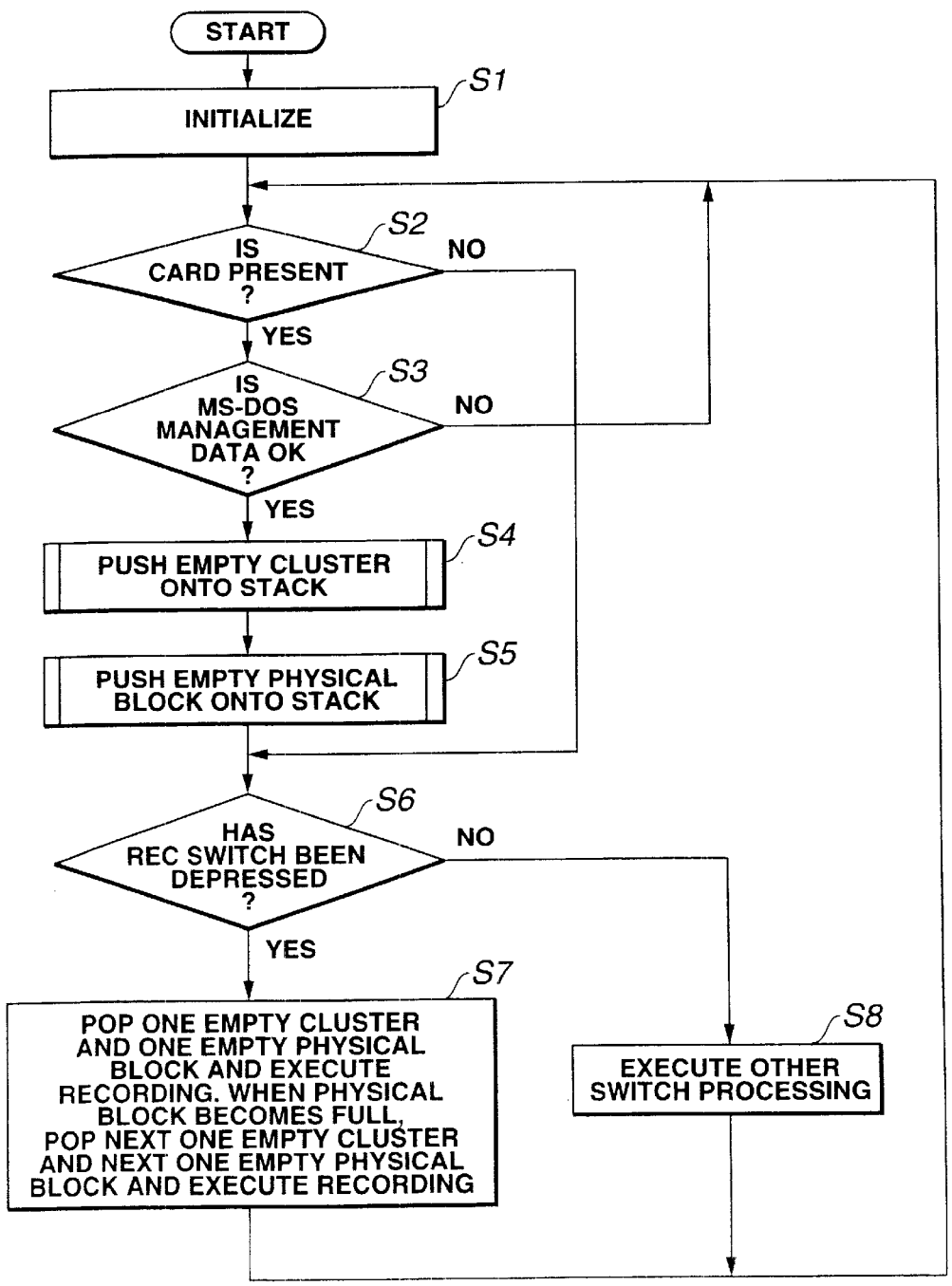

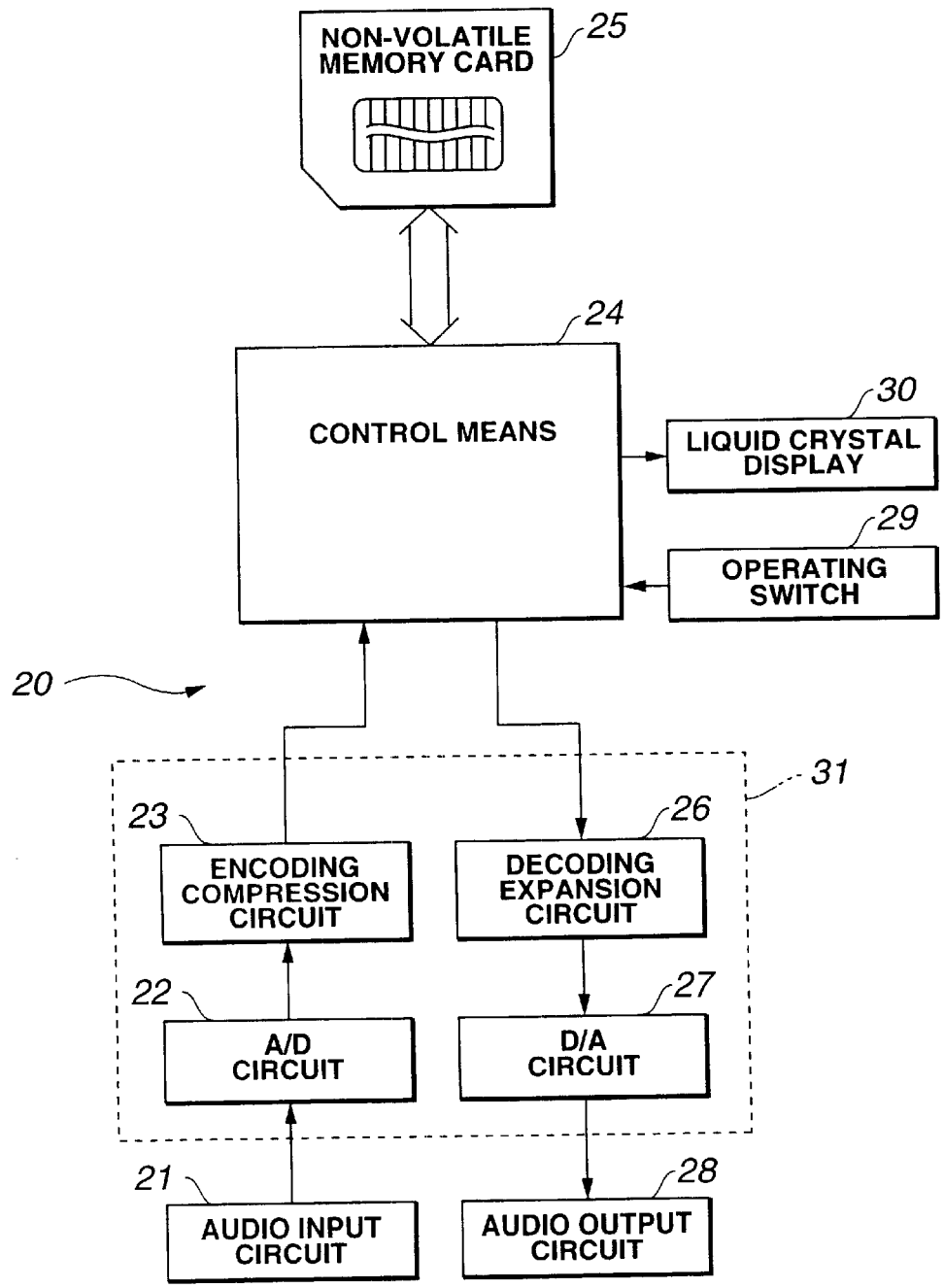

BACKGROUND ART

APPARATUS TO RECORD DIGITAL DATA ON NON-VOLATILE MEMORY CARD FOR RECORDING IN UNITS OF BLOCKS OF DIGITAL DATA AND METHOD THEREOF

BACKGROUND OF THE INVENTION

1. Field of the Invention

The present invention relates to a digital data recording apparatus which performs digital encoding compression on various information signals and records the encoding compressed data on a non-volatile semiconductor memory card, and more particularly, to a digital data recording apparatus which is capable of consecutively recording, without lack of information data, information data such as a moving image or sound which progresses in a time series manner, in empty data areas which discontinuously exist in the non-volatile memory card.

2. Description of the Related Art

In recent years, the recording capacities of non-volatile semiconductor memories have been increasing and the recordable amount of data per non-volatile semiconductor memory has been increasing. Non-volatile semiconductor memories having card-like shapes have been developed, and digital still cameras for recording still images and audio recording equipment which use such cards in place of silver-halide film or audio recording magnetic tape have been developed and put into practice.

This type of digital still camera and audio recording equipment converts an analog signal picked up and generated by a photographic camera or a microphone into a digital signal, performs encoding compression on the digital signal to convert the digital signal into data having a predetermined data format, and records the data on the non-volatile semiconductor memory. The non-volatile semiconductor memory has a data storage area divided into plural physical blocks each of which stores a predetermined amount of data, and is capable of managing recording or erasure of data for each of the physical blocks. In general, in order to enable recorded data to be read and edited on computer equipment, the non-volatile semiconductor memory adopts a data format conforming to MS-DOS which is an OS for computer equipment.

A microprocessor converts the encoding compressed recording data into the data format of MS-DOS and creates management file data relative to the recorded data, and records the encoding compressed recorded data on physical blocks of the non-volatile semiconductor memory. Thus, reading and erasure of data recorded on plural physical blocks are performed by using the file management data.

A specific example of a digital data recording apparatus using the non-volatile semiconductor memory will be described below with reference to FIGS. 10 and 11. FIG. 10 is a block diagram showing the construction of an audio digital data recording/reproducing apparatus, and FIG. 11 is an explanatory view showing the configuration of physical blocks of the non-volatile semiconductor memory.

An audio input circuit 21 of the audio digital data recording/reproducing apparatus 20 shown in FIG. 10 is made of a microphone (not shown) which picks up sound such as music or human voice and generates an analog electrical signal, and an amplifier circuit (not shown) which amplifies the analog electrical signal generated by the microphone.

During recording, the analog audio signal generated by the audio input circuit 21 is converted to a digital audio signal by an analog/digital conversion circuit (hereinafter referred to as the A/D circuit) 22, and the digital audio signal is supplied to an encoding compression circuit 23. The encoding compression circuit 23 performs encoding compression on the digital audio signal, thereby generating predetermined digital compressed data. The encoding compression in the encoding compression circuit 23 uses the compression technique of G729A which is an ITU (the International Telecommunications Union) standard. The digital encoding compressed data generated by the encoding compression circuit 23 is recorded on a card provided with a non-volatile semiconductor memory (hereinafter referred to as the non-volatile memory card) 25, via a control means 24 composed of a microprocessor (MPU). As is well known, the microprocessor is also called CPU, and is made of one chip on which are integrated various units such as an arithmetic unit which performs arithmetic and logic operations, a control unit which performs interpretations of instructions and generation of control signals, and a storage unit. The control means 24 exerts control on writing and reading of the digital encoding compressed data to and from the non-volatile memory card 25, and also generates management data on the written digital encoding compressed data.

During reproduction, the digital encoding compressed data read from the non-volatile memory card 25 under the control of the control means 24 is expanded and decoded by a decoding expansion circuit 26, whereby the digital encoding compressed data is converted to a digital audio signal. The digital audio signal generated by the decoding expansion circuit 26 is converted to an analog audio signal by a digital/analog conversion circuit (hereinafter referred to as the D/A circuit) 27, and the analog audio signal is supplied to an audio output circuit 28 made of an amplifier circuit and a speaker (none of which is shown).

An operating switch 29 and a liquid crystal display 30 are connected to the control means 24. The operating switch 29 serves as an operating input means which has a switch for entering an operation input, such as audio recording, audio reproduction or power-off, into the audio digital data recording/reproducing apparatus 20. The liquid crystal display 30 displays the operating state of the audio digital data recording/reproducing apparatus 20 according to the input form the operating switch 29.

Incidentally, the non-volatile memory card 25 is capable of being removably fitted into a card slot provided in the body (not shown) of the audio digital data recording/reproducing apparatus 20.

The A/D circuit 22, the encoding compression circuit 23, the decoding expansion circuit 26 and the D/A circuit 27 are formed as a one-chip audio processing integrated circuit (hereinafter referred to as the audio processing IC).

The recording state of the digital encoding compressed data to be recorded on the non-volatile memory card 25 of the audio digital data recording/reproducing apparatus 20 having the above-described construction will be described below with reference to FIG. 11.

If the non-volatile semiconductor memory used in the non-volatile memory card 25 has a recording capacity of, for example, 8 Mbytes, the data recording area of the non-volatile semiconductor memory is managed in the state of being divided into 1,024 physical blocks. The state of the physical blocks is schematically shown in FIG. 11.

Assuming that data are already recorded on physical blocks 0 to 2, physical blocks 4 and 5 and physical blocks 8 to 1014 in the non-volatile memory card 25, if new digital encoding compressed data are to be recorded, the physical blocks are searched in order from physical block 0 and the new digital encoding compressed data are sequentially recorded on unrecorded physical blocks. In this case, the shown physical blocks 3, 6 and 7 are immediately detected by search, but it takes time to detect an unrecorded physical block such as physical block 1015 located near the bottom.

In a digital data recording apparatus provided with the non-volatile memory card 25, during recording of digital data such as sound or a moving image which progresses in a time series manner, even while an unrecorded physical block is being searched for in the non-volatile memory card 25, the data progresses, so that there is a possibility that when the data is recorded after an unrecorded physical block has been detected, the data which has progressed during the search may be lost.

Incidentally, each of the clusters shown in FIG. 11 is a logical minimum unit of a file managed by the FAT (File Allocation Table) file system of MS-DOS which will be described later, and the respective clusters are present to correspond to the physical blocks.

As described above, in the related art, when digital data compressed by digital encoding on the basis of information which continuously progresses in a time series manner is to be newly recorded on the non-volatile memory card, an unrecorded physical block of the non-volatile memory card is searched for, and each time an unrecorded physical block is discovered, the digital encoding compressed data is recorded. This leads to the problem that even while the unrecorded physical block is being searched for, the digital encoding compressed data to be newly recorded progresses, and when the unrecorded physical block is discovered and recording of the digital encoding compressed data is started, data which progresses during the search for the unrecorded physical block will be lost.

SUMMARY OF THE INVENTION

The invention provides a digital data recording apparatus which, when recording of new digital data on a non-volatile memory card, is capable of quickly searching for an unrecorded physical block and recording the new digital data on the unrecorded physical block without lack of digital data.

According to the invention, a digital data recording apparatus comprises: a digital encoding compression means for converting analog information which progresses in a time series manner into digital encoding compressed data; an empty area detection means for detecting an unrecorded empty area of a non-volatile memory card which records in predetermined units of blocks the digital encoding compressed data converted by the digital encoding compression means; a storage means for storing in advance information on an empty area of the non-volatile memory card detected by the empty area detection means; and a recording control means for executing control to record the digital encoding compressed data on the empty area of the non-volatile memory card on the basis of the information on the empty area stored in the storage means, and generating recording data containing management data on the digital encoding compressed data.

In the digital data recording apparatus, an unrecorded empty area of the non-volatile memory card is searched for and the detected empty area information is stored in the storage means in advance in preparation for recording. During recording, since the digital encoding compressed data is recorded in an empty area of the non-volatile memory card on the basis of the empty area information stored in the storage means in advance, it is possible to quickly search for an unrecorded physical block of the non-volatile memory card and record new digital data on the unrecorded physical block. Since a search for the unrecorded physical block is quickly performed, lack of digital data can be prevented from occurring in digital data to be recorded.

According to the invention, in the digital data recording apparatus, the empty area detection means searches through recording areas of the non-volatile memory card from a leading location to a terminal location and stores detected empty area information by continuously pushing the detected empty area information onto a stack of the storage means in search order. The recording control means executes control to start recording from a recording area which corresponds to final empty area information stored on the stack of the storage means, when the recording control means is to record new digital encoding compressed data on the non-volatile memory card.

According to the invention, in the digital data recording apparatus, the empty area detection means searches through recording areas of the non-volatile memory card from a terminal location to a leading location and stores detected empty area information by continuously pushing the detected empty area information onto a stack of the storage means in search order. The recording control means executes control to start recording from a recording area which corresponds to final empty area information stored on the stack of the storage means, when the recording control means is to record new digital encoding compressed data on the non-volatile memory card.

According to the invention, the digital data recording apparatus further comprises a memory card fitting detection means for detecting whether the non-volatile memory card has been fitted into a body of the digital data recording apparatus, and the non-volatile memory card is removably provided in the body of the digital data recording apparatus, and the empty area detection means executes a search for an empty area of the non-volatile memory card when the memory card fitting detection means detects that the non-volatile memory card has been fitted.

In the above-described digital data recording apparatus, when the memory card fitting detection means provided in a card slot device of the body of the digital data recording apparatus detects that the non-volatile memory card has been fitted, the empty area detection means executes a search for an empty area of the non-volatile memory card. Accordingly, when the non-volatile memory card is fitted, empty area information can be automatically stored in the storage means.

According to the invention, the digital data recording apparatus further comprises an input means for setting an operating mode of the body of the digital data recording apparatus, and the empty area detection means executes a search for an empty area of the non-volatile memory card when the input means is operated.

In the above-described digital data recording apparatus, after the non-volatile memory card has been fitted into the body of the digital data recording apparatus, a search for an empty area of the non-volatile memory card is executed when any key of the operation input means, for example, a reproducing switch is operated. Accordingly, as long as the non-volatile memory card is fitted, a user can at will execute a search for an empty area at any time.

According to the invention, the digital data recording apparatus further comprises a remaining capacity calculation means for finding a total empty area quantity on the basis of empty area information stored by being pushed onto a stack of the storage meansand calculates a recordable time from the total empty area quantity and a recording time per unit empty area.

In the above-described digital data recording apparatus, since the total empty area quantity is found on the basis of the empty area information stored in the storage means and the remaining recording time is calculated on the basis of the total empty area quantity, it is possible to quickly calculate and display the remaining capacity.

According to the invention, in the digital data recording apparatus, when empty area information detected by the empty area detection means is to be stored by being pushed onto a stack of the storage means, a first detected empty area is stored by being pushed onto the bottom of the stack of the storage means in accordance with a logical initial value corresponding to a value indicative of a maximum recording area quantity of the non-volatile memory card, and the empty area information is assigned a logical number obtained by decrementing the logical initial value by one in units of empty areas each time the empty area information is pushed, recording being executed in order from the top of empty areas pushed in the stack of the storage means when new digital encoding compressed data is being recorded on the non-volatile memory card.

BRIEF DESCRIPTION OF THE DRAWINGS

FIGS. 3A to 3C are explanatory views illustrating the operation of pushing in a RAM an empty physical block and an empty cluster of a non-volatile memory card for use with the digital data recording apparatus according to the invention;

FIGS. 4A to 4C are explanatory views illustrating the configuration of management data of the non-volatile memory card of the digital data recording apparatus according to the invention;

FIG. 5 is a flowchart illustrating the processing of searching for an empty physical block and an empty cluster of the non-volatile memory card according to the invention and the processing operation of popping the empty physical block and the empty cluster of the non-volatile memory card;

FIG. 10 is a block diagram showing the construction of a related-art digital data recording apparatus.

DETAILED DESCRIPTION OF THE PREFERRED EMBODIMENTS

Figure 1:
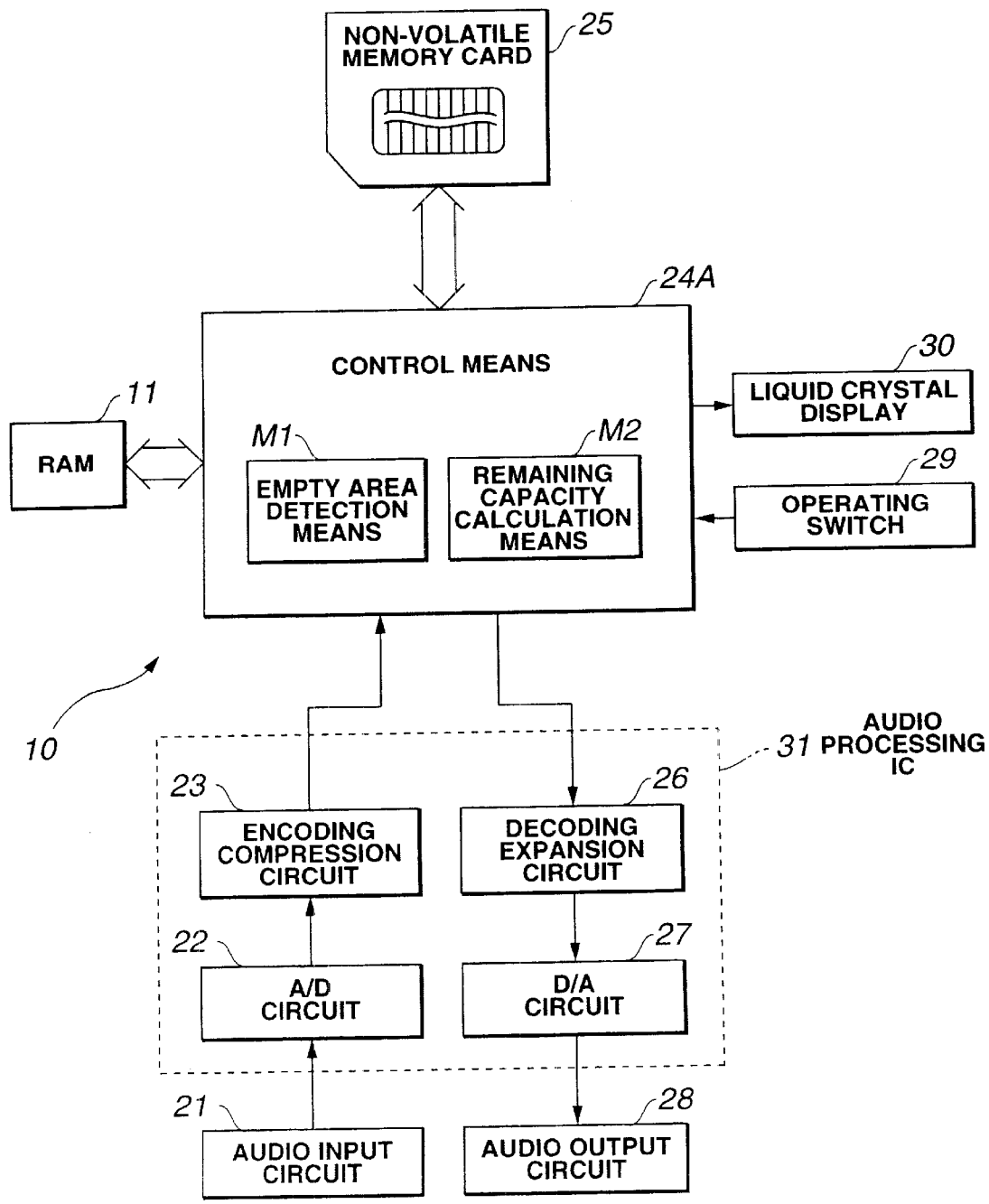
FIG. 1 is a block diagram showing a digital data recording apparatus according to one embodiment of the invention.

Preferred embodiments of the present invention will be described below in detail with reference to the accompanying drawings. FIG. 1 is a block diagram showing a digital data recording apparatus according to one embodiment of the invention. In FIG. 1, identical reference numerals are used to denote part identical to those shown in FIG. 10, and the detailed description of the identical part is omitted.

Figure 2:
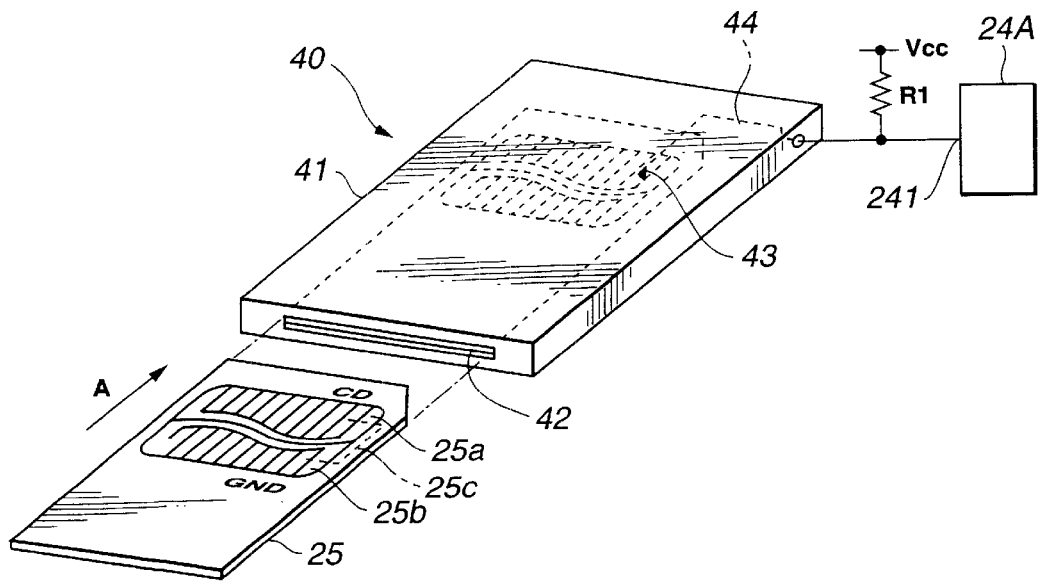
FIG. 2 is a perspective view showing a card slot device.

The digital data recording/reproducing apparatus 10 shown in FIG. 1 differs from the apparatus shown in FIG. 10 in that a control means 24A composed of a microprocessor (MPU) which controls the exchange of data between an audio processing IC 31 and a non-volatile memory card 25 has a built-in empty recording area searching processing means (to be described later) which includes an empty area detection means, and a RAM 11 which serves as a storage means is connected to the control means 24A. The physical blocks of the non-volatile memory card 25 are searched under the control of the control means 24A, and an unrecorded physical block is pushed onto a stack in the RAM 11 and is temporarily stored therein. Incidentally, the control means 24A may be composed of a circuit having the same function as that of the microprocessor. The non-volatile memory card 25 is capable of being removably fitted into a card slot device provided on the body of the digital data recording/reproducing apparatus 10, and a memory card fitting detecting means provided in the card slot device detects whether the non-volatile memory card 25 has been fitted into the body of the digital data recording/reproducing apparatus 10. FIG. 2 shows an example of the construction of the card slot device.

Referring to FIG. 2, a card slot device 40 includes a body 41, a slot 42 into which the non-volatile memory card 25 is fitted, a detecting contact 43 for detecting whether the non-volatile memory card 25 has been fitted, by making contact with a card detection side electrode portion 25a when the non-volatile memory card 25 is fitted into the slot 42, and a lead 44 connected to the detecting contact 43. The card detection (CD) side electrode portion 25a and a ground (GND) side electrode portion 25b are formed on a surface of the non-volatile memory card 25 in such a manner that the electrode portions 25a and 25b are opposed to each other. Both electrode portions 25a and 25b are electrically connected to each other by a lead 25c in the non-volatile memory card 25.

One end of the lead 44 connected to the detecting contact 43 in the card slot device 40 extends outward from the body 41, and is connected to a DC power line Vcc via a resistor R1 outside the card slot device 40 and is also connected to a detecting terminal 241 of the control means 24A.

In the construction shown in FIG. 2, before the non-volatile memory card 25 is inserted into the card slot device 40, the detecting terminal 241 of the control means 24A is held at a high level by the voltage of the DC power line Vcc. When the non-volatile memory card 25 is inserted and fitted into the card slot device 40, the detecting contact 43 in the body 41 of the card slot device 40 makes contact with the card detection side electrode portion 25a, whereby the detecting terminal 241 of the control means 24A is connected to the ground side electrode portion 25b and goes to a low level. Thus, the control means 24A can detect the fitting of the non-volatile memory card 25.

A method of temporarily storing an unrecorded physical block in the RAM 11 will be described below with reference to FIGS. 3A, 3B and 3C. FIG. 3A is a view showing the recording physical blocks of the non-volatile memory card 25, and FIGS. 3B and 3C are explanatory views showing the manner of pushing onto said RAM11.

FIG. 3A schematically shows the manner in which the recording physical blocks are managed on the basis of the MS-DOS file format in the 8-Mbyte non-volatile memory card 25, and the recording physical blocks are made of 1,024 physical blocks 0 to 1023. Physical blocks 0 to 8 constitute a management data area, and an IPL (Initial Program Loader) is recorded on physical block 0, a FAT (File Allocation Table) is recorded on physical blocks 1 and 2, and directory entries are recorded on physical blocks 3 to 8. Physical blocks 9 to 1023 constitute an area in which digital data are recorded. The shaded portions of FIG. 3A indicate physical blocks on which data are recorded, and digital encoding compressed data are recorded on physical blocks 9 to 11 and 16 to 1013.

When the non-volatile memory card 25 having the recorded and unrecorded physical blocks shown in FIG. 3A is fitted into the digital data recording/reproducing apparatus 10 and the fitting of the non-volatile memory card 25 is detected, the control means 24A detects an unrecorded physical block by searching the physical blocks in order from 0 in the non-volatile memory card 25 by means of the built-in empty recording area searching processing means in preparation for the recording of new digital encoding compressed data, and pushes the detected empty block onto the stack of the RAM 11. In other words, the control means 24A detects an empty block by searching the physical blocks shown in FIG. 3A, and pushes the empty block onto the stack of RAM 11 in search order as shown in FIG. 3B. At this time, the initial value of the stack pointer (SP) of the first detected empty block (in FIG. 3A, physical block 12) is set to 1023. The initial value 1023 of the stack pointer corresponds to the maximum number of physical blocks (i.e., maximum address) of the non-volatile memory card 25. When the first empty block 12 is pushed at a point indicated by the initial value 1023 of the stack pointer, the next detected empty block 13 is pushed at stack point 1022 obtained by decrementing the initial stack point value by one. In this manner, each time an empty block is detected, the stack point value of the previous pushed empty block is decremented by one and the detected empty block is pushed at the obtained stack point.

The FAT will be described below. The FAT is a data table which, in MS-DOS, manages the physical locations of files recorded on a recording medium (for example, a non-volatile memory card). In MS-DOS, files recorded on a recording medium are managed in units of "clusters". If a file has a file size which exceeds one cluster, the file is recorded over two or more clusters, but the file will not necessarily be recorded on consecutive clusters. For this reason, the FAT manages the locations and order of clusters on which one file is recorded. In the FAT, the locations of files on the recording medium are recorded as cluster numbers. Therefore, the maximum number of clusters per recording medium is determined by the number of bits required for the FAT to manage cluster numbers. In an 8-Mbyte non-volatile memory card, if the cluster size is 8 Kbytes and clusters are managed with 12 bits, 1,024 can be represented.

As described above, since the non-volatile memory card 25 conforms to MS-DOS, the non-volatile memory card 25 is assigned clusters which are logical blocks, in addition to the physical blocks. The control means 24A searches these clusters for an unused empty cluster by means of the empty recording area searching processing means in a manner similar to that described previously in connection with the physical blocks, and pushes the detected unused empty cluster onto another stack in the RAM 11 as shown in FIG. 3C. Similarly, the initial value of the stack pointer is set to 1023 when the empty cluster is pushed onto the stack, and each time one empty cluster is pushed, the stack point is decremented by one to newly set a cluster point.

In other words, the control means 24A searches both the physical blocks and the logical blocks, extracts an empty block and an empty cluster, and pushes the extracted empty block and cluster onto the respective stacks. When the extracted empty block and cluster are pushed onto the respective stacks of the RAM 11, the maximum value 1023 of each of the physical block and the cluster in which digital encoding compressed data can be stored is set as the initial value of the stack pointer, and each time one physical block and one cluster are pushed onto the respective stacks, the initial stack point value is decremented by one and a stack point value is newly set.

Consequently, as shown in FIG. 3B, data indicative of physical block 12 is stored at stack point 1023 in the RAM 11. From this data at stack point 1023 which is the bottom of the stack, data indicative of empty physical blocks are consecutively stored in (i.e., pushed on) the stack of the RAM 11, and data indicative of empty physical block 1023 is stored at stack point 900 and this stack point 900 is set to the top of the stack. Similarly, as shown in FIG. 3C, data indicative of empty clusters are consecutively stored (i.e., pushed on) on the stack of the RAM 11, and data indicative of empty cluster 12 is stored at stack point 1023 (bottom) while data indicative of empty cluster 1023 is stored at stack point 900 (top).

In the recording apparatus provided with the RAM 11 constructed in the above-described manner, if a recording mode is set by the operating switch 29, digital encoding compressed data to be newly recorded is generated by the audio processing IC 31, and the control means 24A reads out the contents of data indicative of the empty physical blocks and those of data indicative of the empty clusters which are stored in the respective stacks of the RAM 11, and controls the non-volatile memory card 25 to start recording at empty cluster 1023 and empty physical block 1023 each of which is located at top stack point 900, thereby executing recording of new data. When recording is started at cluster 1023 and physical block 1023 each of which is located at top stack point 900, each of the stack pointers increments top stack point 900 by one, and move to the next stack point 901. When data are recorded up to the full storage capacities of cluster 1023 and physical block 1023 each of which is located at top stack point 900, the remaining data are recorded on cluster 1022 and physical block 1022 each of which is located at stack point 901. In this manner, during the recording of new data, a stack point at which the new data are being recorded is incremented by one and the new data are sequentially recorded without lack of digital data.

In this manner, since empty clusters and empty physical blocks are detected before the start of recording of new data, data which progress in a time series manner and are consecutively inputted can be recorded without lack of digital data, that is to say, audio data can be recorded without being at all lost.

Incidentally, in the above description of FIGS. 3A to 3C, to detect an empty area, the recording area of the non-volatile memory card 25 is searched from the leading location to the terminal location. However, as another embodiment, the recording area of the non-volatile memory card 25 may be searched in the opposite direction, i.e., from the terminal location to the leading location so that a detected empty area is pushed on the stack of the RAM 11.

The above description has referred to the construction in which when it is detected that the non-volatile memory card 25 is fitted into the card slot device 40 shown in FIG. 2, a search for an empty area of the non-volatile memory card 25 is executed. However, there occasionally occurs the problem that while a user is inserting the non-volatile memory card 25 into the card slot device 40 shown in FIG. 2, the user pulls out the non-volatile memory card 25 before completely fitting it into the card slot device 40. Even in case that the non-volatile memory card 25 is pulled out in an incompletely fitted state, once the card detection side electrode portion 25a of the non-volatile memory card 25 makes contact with the detecting contact 43 of the card slot device 40, a memory card fitting detection signal is inputted to the control means 24A, so that an empty area search is started in the non-volatile memory card 25 and the pushing of an empty area onto the stacks of the RAM 11 is started. During the process of the empty area search, if the non-volatile memory card 25 is pulled out of the card slot device 40, the pushing of empty areas in the RAM 11 is interrupted halfway. After that, if the non-volatile memory card 25 is inserted into the card slot device 40 to again start an empty area search, there occurs the problem that the present data are pushed onto the previous data accumulated in the stack of the RAM 11.

One measure against this problem is to construct the apparatus so that after the non-volatile memory card 25 has been completely fitted into the card slot device 40, a search for an empty area of the non-volatile memory card 25 is executed when, for example, a reproduction mode switch of the operating switch 29 is operated. In this manner, by executing an empty area search when the reproduction mode switch is operated, it is possible to push empty area detection information on the stack of the RAM 11 before a recording mode is set (inputted) at a later time.

Incidentally, the apparatus can also be constructed to execute an empty area search when a recording mode switch of the operating switch 29 is operated, but when performing the first operation of the recording mode switch after the fitting of the non-volatile memory card 25, the time required to complete an empty area search in the non-volatile memory card 25 becomes a waiting time and it becomes impossible to immediately start recording data. However, when performing the second or later operation of the recording mode switch, since it is possible to use empty area information stored in the first operation, it is possible to start recording data without any waiting time.

When the control means 24A records new data in a previously detected empty area of the non-volatile memory card 25, the control means 24 generates management data such as recording locations and records the management data in directory entries and the FAT. The generation of the management data will be described below with reference to FIGS. 4A to 4C. FIG. 4A is an explanatory view showing the state in which data are written in physical blocks and clusters 0 to 18, FIG. 4B is an explanatory view showing the contents of directory entries, and FIG. 4C is an explanatory view showing the contents of the FAT.

It is assumed here that, as shown in FIG. 4A, in the non-volatile memory card 25, an IPL, a FAT and direction entries which constitute management data are recorded on physical blocks 0 to 8 and on clusters 0 to 8, the data of a file 3 are recorded on six physical blocks 9 to 12, 15 and 16 and on six clusters 9 to 12, 15 and 16, the data of a file 2 are recorded on physical blocks 13 and 14 and on clusters 13 and 14, and the data of a file 4 are recorded on physical blocks 17 and 18 and on clusters 17 and 18. As shown in FIG. 4B, the directory entries regarding the data of the files 2 to 4 contain information data such as file name, date and time of data recording, FAT and file size. For example, the directory entry of the file name "file 3" contains recording time: 00:00, recording date: XX/XX/XX, FAT: 9, start cluster number of the file 3, and file size: 48 Kbytes (because this file are recorded over six clusters). Incidentally, the recording quantity per cluster is 8 Kbytes. The directory entries of the files 2 and 4 also contain similar recordings. The directory entries of all the files recorded on the non-volatile memory card 25 are recorded in this manner. According to the data of the file 3 recorded in the directory entry, the FAT indicates the first cluster number of the clusters on which the file 3 is recorded, and the data of the file size indicates how many clusters are used, but data indicating which cluster numbers are used is not contained in the directory entry. For this reason, as shown in FIG. 4C, the following FAT data are recorded: FAT data indicating that the leading cluster 9 of the file 3 is followed by cluster 10, FAT data indicating that cluster 10 is followed by cluster 11, FAT data indicating that cluster 11 is followed by cluster 12, FAT data indicating that cluster 12 is followed by cluster 15, FAT data indicating that cluster 15 is followed by cluster 16, and FAT data indicative of code FFFh indicating that the data of the file 3 comes to an end at cluster 16.

Specifically, when new data is to be recorded on the non-volatile memory card 25, the control means 24A starts recording at the top stack point of the stack of the RAM 11 in which empty physical blocks are stored and at the top stack point of the stack of the RAM 11 in which empty clusters are stored, and generates directory entries and FAT data for the new data and records the directory entries and the FAT data on predetermined clusters of the non-volatile memory card 25. Accordingly, when performing reproduction, it is possible to quickly search for the desired file and data.

An embodiment in which the empty physical blocks and the empty clusters of the non-volatile memory card 25 are searched and the remaining recordable capacity of the non-volatile memory card 25 is calculated and displayed on the basis of the empty physical blocks and the empty clusters pushed onto and stored in the RAM 11, will be described below.

When data are to be pushed onto the respective stacks of the RAM 11, each of the maximum values of the physical blocks and the clusters of the non-volatile memory card 25 is used as the initial value of the stack point, and the maximum value is set to the bottom value of each of the stacks. Each time an empty physical block and an empty cluster are detected, the present stack point is decremented by one and each of the stacks is assigned a new stack point, and stack points which are obtained when all the empty physical blocks and clusters are detected are respectively set to top stack point values. Moreover, when recording new data, recording is started at each of the top stack point values so that a stack point obtained when a stack point at which recording is being performed is incremented by one indicates the next physical block and cluster to be recorded.

Accordingly, by subtracting a stack point value at which recording is being performed from the bottom stack point value, it is possible to calculate the remaining number of recordable physical blocks and that of recordable clusters. By multiplying the calculated remaining numbers of physical blocks and clusters by the recording time per physical block or cluster, it is possible to calculate the remaining recordable time.

In this embodiment, a remaining recordable capacity calculation processing means provided with a remaining capacity calculation means M2 which calculates such remaining recordable time is incorporated in the control means 24A. In operation, when a remaining recordable capacity display mode is inputted from the operating switch 29 of the digital data recording/reproducing apparatus 10, a recordable time which is found from the stack points of the empty physical blocks and clusters remaining in the RAM 11 by the remaining recordable capacity calculation processing means of the control means 24A can be displayed on the liquid crystal display 30.

The processing of pushing an empty physical block and an empty cluster of the non-volatile memory card 25 onto the RAM 11 and the processing of popping a pushed empty physical block and empty cluster off the RAM 11 will be described below with reference to the flowchart of FIG. 5. Incidentally, these processing operations are performed by the control means 24A.

When an arbitrary switch of the operating switch 29 is operated, the control means 24A initializes the RAM 11 in Step S1, and in Step S2, determines whether the non-volatile memory card 25 has been fitted into the card slot of the digital data recording/reproducing apparatus 10. If it is determined in Step S2 that the fitting of the non-volatile memory card 25 has been confirmed, the control means 24A, in Step S3, confirms the MS-DOS management data of the non-volatile memory card 25. If the MS-DOS management data is confirmed in Step S3, the control means 24A searches for empty clusters in the non-volatile memory card 25, and pushes the detected empty clusters onto the corresponding stack of the RAM 11. When the pushing of the empty clusters in Step S4 is completed, the control means 24, in Step S5, pushes empty physical blocks of the non-volatile memory card 25 onto the corresponding stack of the RAM 11 in Step S4. When the pushing of the empty physical blocks in Step S5 is completed, the control means 24A, in Step S6, confirms the content of the switch operation of the operating switch 29. If the operated switch is a recording switch, the control means 24A, in Step S7, extracts the empty cluster and the empty physical block located at the top stack points of the respective stacks of the RAM 11, and records digital encoding compressed data signal-processed by the audio processing IC 31 on the physical block of the cluster of the non-volatile memory card 25 that corresponds to the extracted empty cluster and empty physical block. If the amount of the data exceeds the recording capacity of the physical block during recording, the control means 24A extracts the empty physical block and the empty cluster located at the next stack points, and consecutively records the remaining data on the empty physical block of the corresponding empty cluster of the non-volatile memory card 25. In this manner, while new data is being consecutively inputted, the control means 24A extracts an empty physical block and an empty cluster one by one from the top stack points of the respective stacks of the RAM 11, and performs recording.

If the fitting of the non-volatile memory card 25 is not confirmed in Step S2, the process proceeds to Step S6. If the MS-DOS management data of the non-volatile memory card 25 is not confirmed in Step S3, the control means 24A determines that the fitted memory card 25 is a non-conforming memory card, and returns the process to Step S2. If the control means 24A determines in Step S6 that a switch other than the recording switch has been operated, the control means 24A, in Step S8, performs processing according to the operating mode of the switch other than the recording switch.

Incidentally, if part or all of the recorded files of the non-volatile memory card 25 are to be erased, file names to be erased are specified before erasure. During erasure, by pushing physical blocks and clusters of erased files onto the respective stacks of the RAM 11, empty physical blocks and empty clusters which are produced by erasure in the non-volatile memory card 25 can readily be stored in the respective stacks of the RAM 11.

Figure 6:
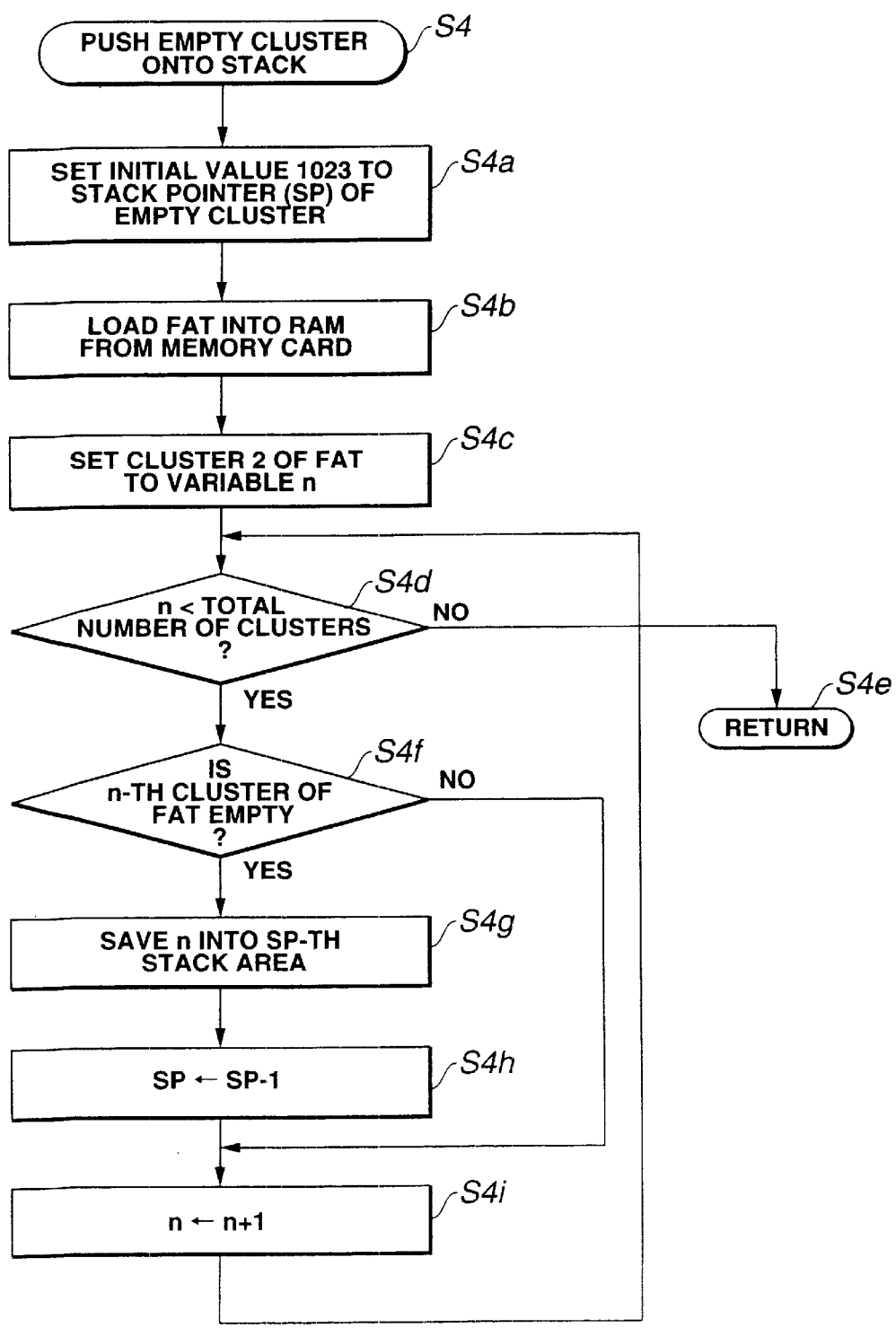
FIG. 6 is a flowchart which constitutes part of the flowchart of FIG. 5 and illustrates the processing operation of pushing empty clusters onto the corresponding stack of the RAM.

The processing of Step S4 to push empty clusters onto the corresponding stack of the RAM 11 will be described below with reference to FIG. 6.

When the processing of Step S4 to push empty clusters onto the stack is started, the control means 24A, in Step S4a, sets the initial value (1023) of the stack pointer (SP) to the bottom of the empty-cluster stack of the RAM 11. In Step S4b, a FAT (refer to FIG. 4A) of the non-volatile memory card 25 is loaded into the RAM 11. Then, the control means 24A sets the cluster of the FAT loaded in Step S4c to cluster 2, and sets the FAT cluster 2 to a variable n. Then, in Step S4d, the control means 24A determines whether the variable n is smaller than the total number of clusters of the FAT. If the control means 24A determines that the variable n is smaller than the total number of clusters of the FAT, the control means 24A, in Step S4f, reads out the n-th cluster of the FAT and determines whether the n-th cluster is an empty cluster. If it is determined that the n-th cluster is a recorded cluster, the process proceeds to Step S4i, in which the control means 24A sets a new variable n by incrementing the variable n by one, and then the process returns to Step S4d. That is to say, the control means 24A checks the states of the clusters 3 to 18 shown in FIG. 4A. If it is determined in Step S4f that the n-th cluster is an empty cluster, the control means 24A, in Step S4g, saves the cluster number "n" into a stack point number pointed to by the stack pointer (SP) in the RAM 11. Specifically, if the cluster 19 shown in FIG. 4A is the first empty cluster, the control means 24A saves the cluster number "19" which indicates the cluster area "n" into the initial value 1023 of the stack pointer. Then, in Step S4h, the control means 24A decrements by one the stack point number of the cluster area saved in Step S4g, and moves the stack pointer (SP) to a new stack point. Moreover, in Step S4i, the control means 24A increments the variable n by one to generates a new variable n, and returns to Step S4d to repeatedly push an empty cluster onto the stack.

Figure 7:
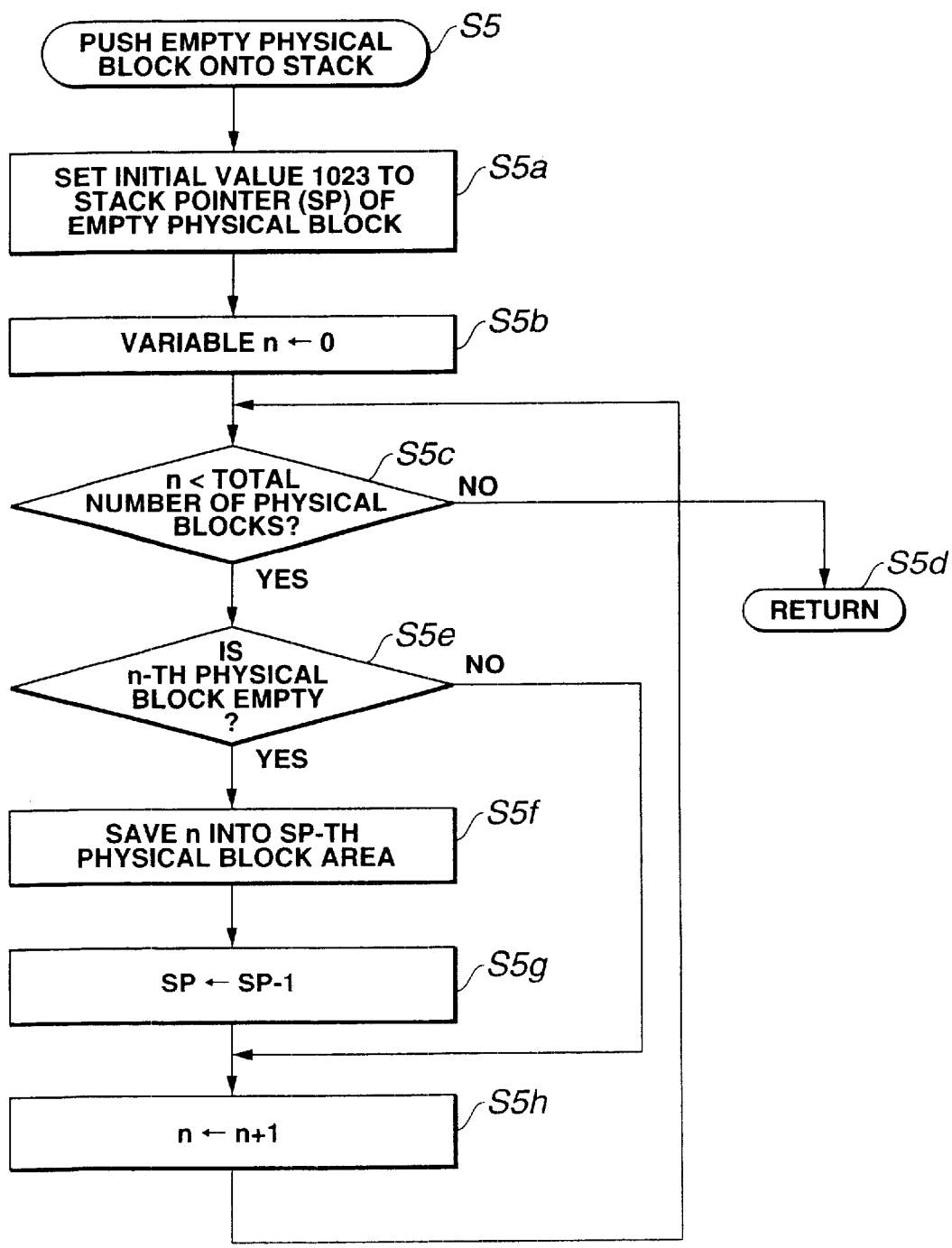
FIG. 7 is a flowchart which constitutes part of the flowchart of FIG. 5 and illustrates the processing operation of pushing empty physical blocks onto the corresponding stack of the RAM.

The processing of Step S5 to push empty physical blocks onto the corresponding stack of the RAM 11 will be described below with reference to FIG. 7.

When the processing of Step S5 to push empty physical blocks onto the stack is started, the control means 24A, in Step S5a, sets the initial value (1023) of the stack pointer (SP) to the bottom of the empty-physical-block stack of the RAM 11. In Step S5b, the control means 24A sets "0" to the variable n. Then, in Step S5c, the control means 24A compares the variable n and the total number of physical blocks and determines whether the variable n is smaller than the total number of physical blocks. If the control means 24A determines that the variable n is not smaller than the total number of physical blocks, the process proceeds to Step S5d and is returned to the main program. If it is determined that the variable n is smaller than the total number of physical blocks, the control means 24A, in Step S5e, reads out the n-th physical block and determines whether the n-th physical block is an empty physical block. If it is determined that the n-th physical block is a recorded cluster, the process proceeds to Step S5h, in which the control means 24A increments the variable n by one, and then the process returns to Step S5c. That is to say, the control means 24A checks the states of the physical blocks 3 to 18 shown in FIG. 4A. If it is determined in Step S5e that the n-th physical block is an empty physical block, the control means 24A, in Step S5f, saves the physical block number "n" into a stack point number pointed to by the stack pointer (SP) in the RAM 11. Specifically, if the physical block 19 shown in FIG. 4A is the first empty physical block, the control means 24A saves the physical block number "19" into the initial value 1023 of the stack pointer. Then, in Step S5g, the control means 24A decrements by one the stack point number of the physical block saved in Step S5f, and moves the stack pointer (SP) to a new stack point. Moreover, in Step S5h, the control means 24A increments the variable n by one and generates a new variable n, and returns to Step S5c to repeatedly push an empty physical block number onto the stack.

Through the above-described processing, data indicative of the empty physical blocks and the empty clusters of the non-volatile memory card 25 are pushed onto the respective stacks of the RAM 11.

Figure 8A:
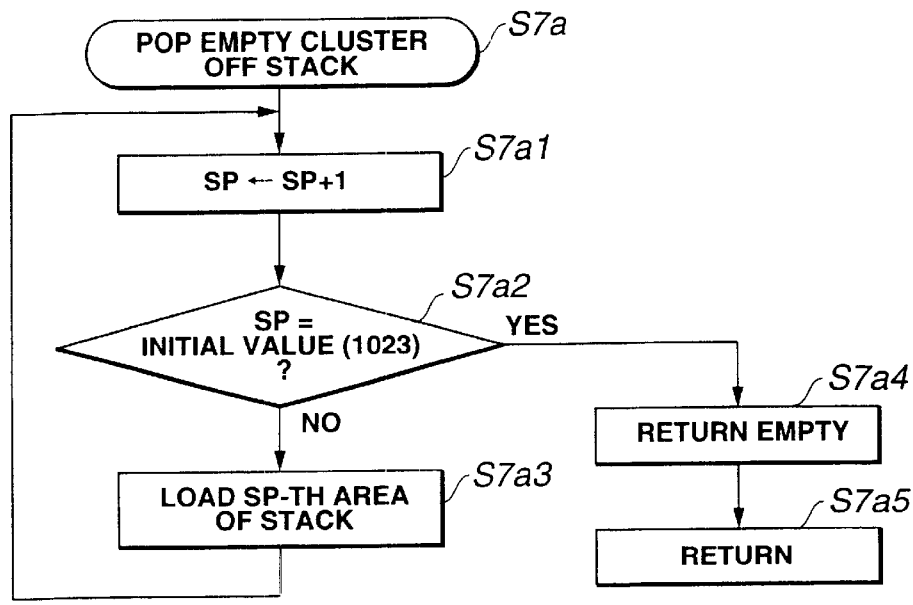
FIGS. 8A and 8B are flowcharts which constitute part of the flowchart of FIG. 5 and illustrate the processing operation of popping an empty cluster and an empty physical block from the respective stacks of the RAM and recording new data.
Figure 8B:
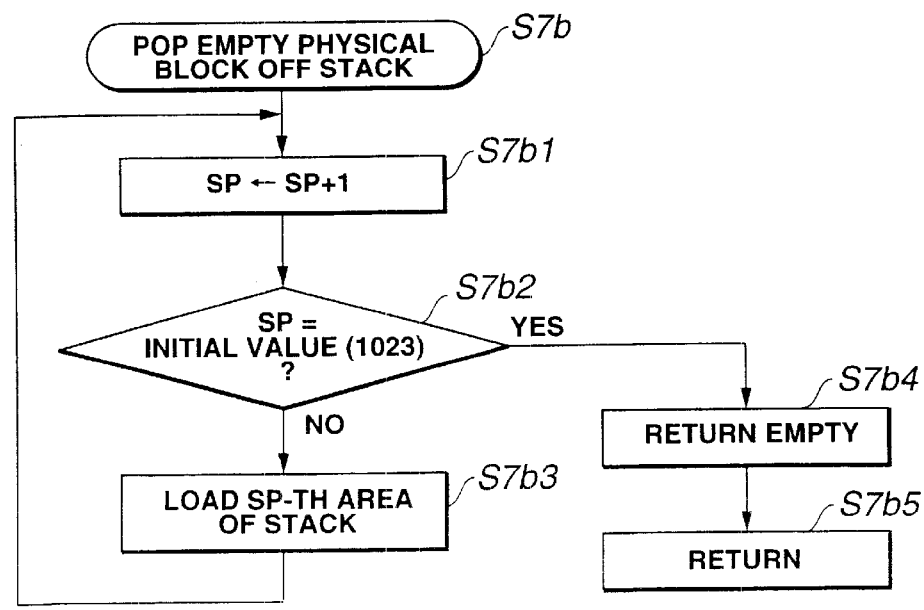
Figure 11:
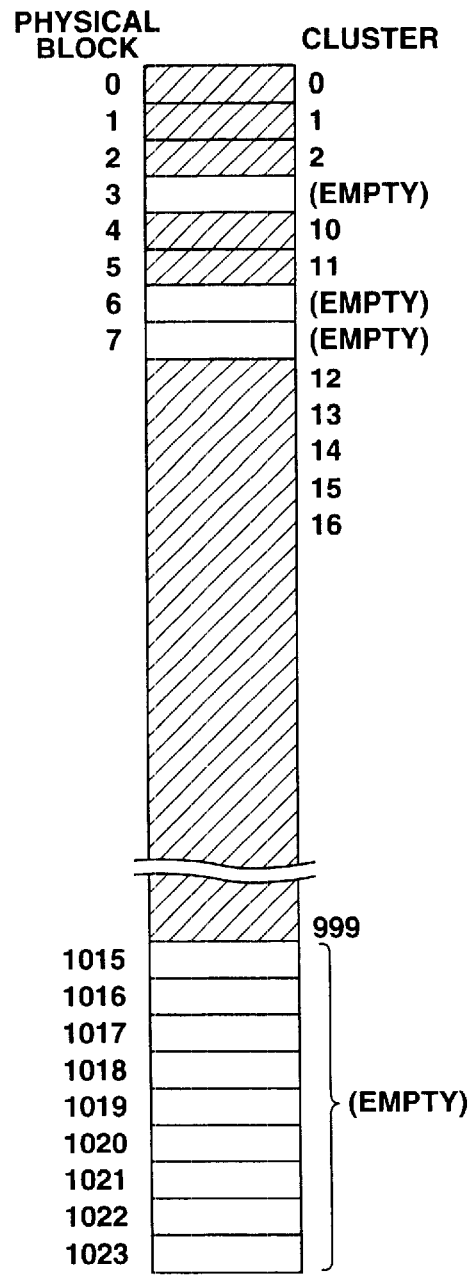
FIG. 11 is an explanatory view illustrating the problems of the related-art digital data recording apparatus.

The processing of recording new digital encoding compressed data by using the data indicative of the empty physical blocks and the empty clusters pushed onto the stack of the RAM 11 in Step S7 will be described below with reference to FIGS. 8A and 8B.

The processing of Step S7 to pop an empty cluster and record new data will be described below with reference to FIG. 8A. When the control means 24A starts Step S7a for popping an empty cluster from the stack of the RAM 11, the control means 24, in Step S7a1, reads the top point area pointed to by the stack pointer (SP) from the clusters stored in the stack of RAM 11. In Step S7a2, the control means 24A compares the value of the read stack pointer and the initial value (1023) of the stack pointer, and if the value of the read stack pointer is equal to the initial value (1023), the control means 24A determines that there is no empty cluster. Then, in Step S7a4, the control means 24A determines that the stack is EMPTY, and in Step S7a5, returns the process to the main program. The term "EMPTY" means that all the cluster numbers stored in the stack are extracted. If the control means 24A determines in Step S7a2 that the value of the read stack pointer is not equal to the initial value (1023), the control means 24A, in Step S7a3, loads an area indicated by the stack pointer number and records new data. When the new data is recorded on the area indicated by the stack pointer number, the process returns to Step S7a1, in which the control means 24A increments the value of the stack pointer by one and generates a new stack point, and repeatedly performs Step S7a2 and the following steps.

The processing of Step S7 to pop an empty physical block and record new data will be described below with reference to FIG. 8B. When the control means 24A starts Step S7b for popping an empty cluster from the stack of the RAM 11, the control means 24, in Step S7b1, reads the top point area pointed to by the stack pointer (SP) from the physical blocks stored in the stack of RAM 11. In Step S7b2, the control means 24A compares the value of the read stack pointer and the initial value (1023) of the stack pointer, and if the value of the read stack pointer is equal to the initial value (1023), the control means 24A determines that there is no physical block. Then, in Step S7b4, the control means 24A determines that the stack is EMPTY, and in Step S7b5, returns the process to the main program. If the control means 24A determines in Step S7b2 that the value of the read stack pointer is not equal to the initial value (1023), the control means 24A, in Step S7b3, loads an area indicated by the stack pointer number and records new data. When the new data is recorded on the area indicated by the stack pointer number, the process returns to Step S7b1, in which the control means 24A increments the value of the stack pointer by one and generates a new stack point, and repeatedly performs Step S7b2 and the following steps.

In this manner, the new data can be recorded in order from the top stack point on the basis of the area data of the empty clusters and the empty physical blocks stored in the respective stacks of the RAM 11.

Figure 9:
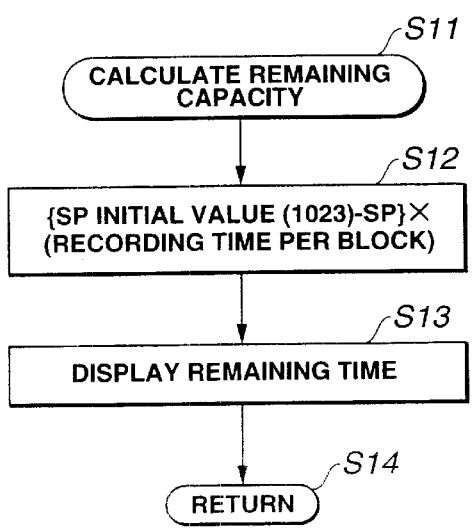
FIG. 9 is a flowchart illustrating the processing of calculating the remaining recordable capacity of the non-volatile memory card according to the invention.

The processing of the control means 24 to calculate the remaining recordable capacity of the non-volatile memory card 25 will be described below with reference to FIG. 9.

When a remaining recordable capacity display mode is inputted from the operating switch 29 in Step S11, the control means 24A, in Step S12, extracts a stack pointer value at which recording is being performed, and subtracts the current value of the stack pointer (SP) from the initial value (1023) of the stack pointer, thereby obtaining the remaining number of clusters. The control means 24A multiplies the obtained remaining number of clusters by the recording time per cluster, i.e., the data recording time per cluster (or physical block), thereby calculating the remaining recording time. Incidentally, since the recording time per cluster (or physical block) of an 8-Mbyte non-volatile memory card is about 8 seconds, the control means 24A multiplies the remaining number of clusters by 8 seconds and converts the product into hours and minutes. Then, in Step S13, the control means 24A converts the hours and the minutes into a display signal for the liquid crystal display 30 and supplies the display signal to the same.

In this manner, the remaining recording capacity of the non-volatile memory card can readily be obtained by the processing of subtracting the remaining stack pointer address stored in the stack of the RAM 11 from the initial address, whereby it is possible to display the remaining recording time even during recording of new data.

As is apparent from the foregoing description, in accordance with the invention, each time a non-volatile memory card is fitted or when a particular operating switch is operated, empty physical blocks and empty clusters are searched for, and each time an empty physical block and an empty cluster are detected, the initial value of the stack pointer is set to the bottom of each of the corresponding stacks in the order of detection, and each of the detected empty physical block and cluster is assigned a stack point obtained by decrementing the stack point value of the bottom by one, and is pushed onto and stored in the corresponding one of the stacks of the RAM 11. On the basis of the data of the stored empty physical block and cluster, an empty physical block and an empty cluster are sequentially read from the tops of the respective stacks and new data are recorded on the read physical block and cluster, whereby digital data which continuously progresses in a time series manner can be consecutively recorded without lack of digital data. In addition, since the address of the stack pointer at which recording is being performed is subtracted from the initial address of the stack pointer, the remaining recording time can be quickly calculated and displayed.

Although each of the embodiments of the invention has been described with reference to an example which records audio information which continuously progresses in a time series manner, it is also possible to record a moving image which continuously progresses in a time series manner.

In each of the embodiments, the operation of searching for an empty physical block and an empty cluster of the non-volatile memory card and pushing a detected empty physical block and a detected empty cluster onto the respective stacks is executed by detecting that the non-volatile memory card is fitted into the card slot device of the digital data recording apparatus. However, the operating switch may also be provided with a dedicated switch for executing the processing of searching for an empty physical block and an empty cluster and pushing them onto the respective stacks of the RAM. In addition, it is possible to adopt a construction in which when the non-volatile memory card is fitted into the card slot device and the recording switch of the operating switch is operated, a search for an empty physical block and an empty cluster is always executed before the recording mode is started. In addition, although the RAM which stores empty physical blocks and empty clusters of the non-volatile memory card is externally connected to the control means including the microprocessor, it is also possible to store empty physical blocks and empty clusters in a RAM built in the microprocessor.

As described above, the invention has the advantages that information which continuously progresses in a time series manner, i.e., time series data which are sequentially inputted, can be instantaneously recorded to empty areas of a non-volatile memory card without lack of digital data, and that the remaining recording time can occasionally be calculated and displayed.

As a matter of course, the invention is not limited to only the above-described embodiments and various modifications can be made without departing from the spirit of the invention.

What is claimed is:

1. A digital data recording apparatus comprising:
    a digital encoding compression means for converting analog information which progresses in a time series manner into digital encoding compressed data;
    an empty area detection means for detecting an unrecorded empty area of a non-volatile memory card which records in predetermined units of blocks the digital encoding compressed data converted by the digital encoding compression means;
    a storage means for storing in advance information on an empty area of the non-volatile memory card detected by the empty area detection means; and
    a recording control means for executing control to record the digital encoding compressed data on the empty area of the non-volatile memory card on the basis of the information on the empty area stored in the storage means, and generating recording data containing management data on the digital encoding compressed data,
    wherein the empty area detection means searches through recording areas of the non-volatile memory card from a leading location to a terminal location and stores detected empty area information by continuously pushing the detected empty area information onto a stack of the storage means in search order, the recording control means executing control to start recording from a recording area which corresponds to final empty area information stored on the stack of the storage means, when the recording control means is to record new digital encoding compressed data on the non-volatile memory card.

2. A digital data recording apparatus comprising:
    a digital encoding compression means for converting analog information which progresses in a time series manner into digital encoding compressed data;
    an empty area detection means for detecting an unrecorded empty area of a non-volatile memory card which records in predetermined units of blocks the digital encoding compressed data converted by the digital encoding compression means;
    a storage means for storing in advance information on an empty area of the non-volatile memory card detected by the empty area detection means; and
    a recording control means for executing control to record the digital encoding compressed data on the empty area of the non-volatile memory card on the basis of the information on the empty area stored in the storage means, and generating recording data containing management data on the digital encoding compressed data,
    wherein the empty area detection means searches through recording areas of the non-volatile memory card from a terminal location to a leading location and stores detected empty area information by continuously pushing the detected empty area information onto a stack of the storage means in search order, the recording control means executing control to start recording from a recording area which corresponds to final empty area information stored on the stack of the storage means, when the recording control means is to record new digital encoding compressed data on the non-volatile memory card.

3. A digital data recording apparatus comprising:
    a digital encoding compression means for converting analog information which progresses in a time series manner into digital encoding compressed data;
    an empty area detection means for detecting an unrecorded empty area of a non-volatile memory card which records in predetermined units of blocks the digital encoding compressed data converted by the digital encoding compression means;
    a storage means for storing in advance information on an empty area of the non-volatile memory card detected by the empty area detection means; and
    a recording control means for executing control to record the digital encoding compressed data on the empty area of the non-volatile memory card on the basis of the information on the empty area stored in the storage means, and generating recording data containing management data on the digital encoding compressed data,
    wherein when empty area information detected by the empty area detection means is to be stored by being pushed onto a stack of the storage means, a first detected empty area is stored by being pushed onto a bottom of the stack of the storage means in accordance with a logical initial value corresponding to a value indicative of a maximum recording area quantity of the non-volatile memory card, the empty area information being assigned a logical number obtained by decrementing the logical initial value by one in units of empty areas each time the empty area information is pushed, recording being executed in order from a top of empty areas pushed in the stack of the storage means when new digital encoding compressed data is being recorded on the non-volatile memory card.

4. An apparatus having a non-volatile memory card which records in units of blocks of digital data, to record the digital data on said non-volatile memory card comprising:
    a signal processor configured to obtain recording digital data;
    an empty detector configured to detect an empty area of said non-volatile memory card in units of blocks to obtain information on the empty area;
    a storage device configured to store the information on the empty area;

a recording control device to continuously push the information on the empty area onto a stack of said storage device in search order; and a remaining capacity calculator configured to find a total empty area quantity on a basis of empty area information pushed onto the stack of said storage device and to calculate a recordable time from the total empty area quantity and a recording time per unit empty area.

5. An apparatus having a non-volatile memory card which records in units of blocks of digital data, to record the digital data on said non-volatile memory card, comprising:

a signal processor configured to obtain recording digital data;

an empty detector configured to detect an empty area of said non-volatile memory card in units of blocks to obtain information on the empty area;

a storage device configured to store the information on the empty area; and a recording control device to continuously push the information on the empty area onto a stack of said storage device in search order;

wherein said empty area information detected by said empty detector is to be pushed onto the stack of said storage device, a first detected empty area is pushed onto a bottom of the stack of said storage device in accordance with a logical initial value corresponding to a value indicative of a maximum recording area quantity of said non-volatile memory card, the empty area information being assigned a logical number obtained by decreasing said logical initial value by one in units of empty areas each time the empty area information is pushed, recording being executed in order from a top of empty areas pushed on the stack of said storage device when new digital data is being recorded on said non-volatile memory card.

* * * * *